US012783019B2

(12) United States Patent
Nishi et al.

(10) Patent No.: US 12,783,019 B2
(45) Date of Patent: Nov. 3, 2026

(54) MAGNETICALLY-ACTUATED DOORS

(71) Applicant: Intel Corporation, Santa Clara, CA (US)

(72) Inventors: Yoshifumi Nishi, Beaverton, OR (US); Alex Gilpin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 450 days.

(21) Appl. No.: 17/693,131

(22) Filed: Mar. 11, 2022

(65) Prior Publication Data

US 2022/0197352 A1 Jun. 23, 2022

(51) Int. Cl.
*G06F 1/18* (2026.01)
*G06F 1/20* (2006.01)
*H05K 5/02* (2006.01)

(52) U.S. Cl.
CPC ........... *G06F 1/181* (2013.01); *H05K 5/0221* (2013.01); *G06F 1/20* (2013.01)

(58) Field of Classification Search
CPC .......... G06F 1/181; G06F 1/20; G06F 1/1677; H05K 5/0221
See application file for complete search history.

(56) References Cited

U.S. PATENT DOCUMENTS

2019/0164675 A1* 5/2019 Srinivasan .............. E05C 19/16
2020/0224455 A1* 7/2020 Ellefred ................ E05C 19/163
2022/0374052 A1 11/2022 Li et al.

FOREIGN PATENT DOCUMENTS

CN 105630117 A * 6/2016 ............... G06F 1/20
CN 107291164 A * 10/2017 ........... G06F 1/1679
WO 2021055834 A1 3/2021
WO WO-2022005455 A1 * 1/2022 ........... G06F 1/3215

OTHER PUBLICATIONS

European Patent Office, “Extended European Search Report,” issued in connection with European Patent Application No. 23 155 527.7, dated Jul. 28, 2023, 122 pages.
European Patent Office, “Communication under Rule 71(3) EPC,” issued in connection with European Patent Application No. 23 155 527.7, dated Apr. 22, 2025, 8 pages.

* cited by examiner

*Primary Examiner* — Allen L Parker
*Assistant Examiner* — Dakota M Talbert
(74) *Attorney, Agent, or Firm* — Hanley, Flight & Zimmerman, LLC

(57) ABSTRACT

Magnetically actuated doors are disclosed. A disclosed example apparatus includes a door to be movably coupled to a frame of a computing device, a first magnet, a magnet array including a second magnet and a third magnet, the door to support the first magnet or the magnet array, and a slide. The slide includes a body supporting the other of the first magnet or the magnet array, and a guide, the body to move along a path defined by the guide, wherein the body in a first location of the path causes the magnet array to attract the first magnet and close the door relative to the frame, and wherein the body in a second location of the path causes the magnet array to repel the first magnet and open the door relative to the frame.

20 Claims, 12 Drawing Sheets

MAGNETICALLY-ACTUATED DOORS

FIELD OF THE DISCLOSURE

This disclosure relates generally to doors and, more particularly, to magnetically-actuated doors.

BACKGROUND

Some computing devices, such as laptops or tablets, utilize openings from dynamic intake vents to enable cooling thereof. These intake vents typically have numerous moving components, as well as control circuitry and hardware, to vary a size of an opening to receive relatively cooler ambient air. Accordingly, these known implementations typically necessitate complex and expensive hinge designs and/or mechanisms to control motion of the aforementioned moving parts.

Figure 1A:
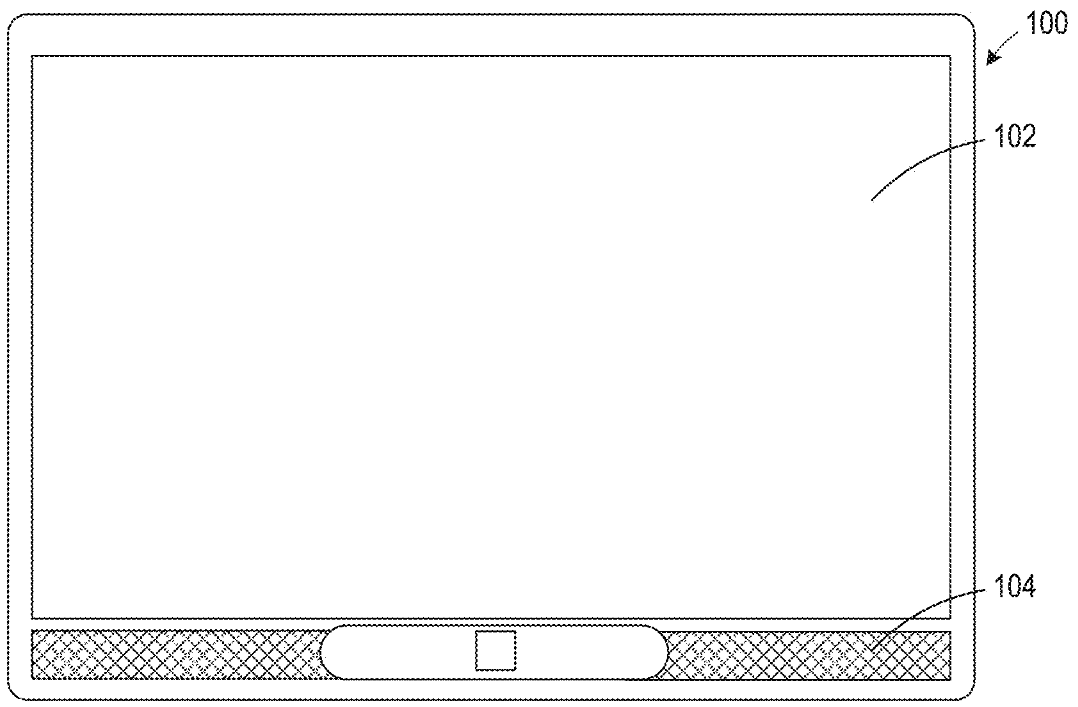
FIGS. 1A and 1B are front and rear views, respectively, of an example computing device in accordance with teachings of this disclosure.

In general, the same reference numbers will be used throughout the drawing(s) and accompanying written description to refer to the same or like parts. The figures are not to scale. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc. Thus, unless otherwise specified, "substantially real time" refers to real time+/−1 second.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of the processing circuitry is/are best suited to execute the computing task(s).

DETAILED DESCRIPTION

Magnetically actuated doors are disclosed. Some known computing devices, such as laptops or tablets, utilize openings from dynamic intake vents to enable cooling thereof. Such intake vents typically have numerous moving components to vary a size of an opening for cooling. Accordingly, these implementations typically necessitate complex and expensive hinge designs and/or mechanisms to control motion of the aforementioned moving parts. In some known systems, accuracy is reduced at certain angular ranges. In particular, these known systems can have difficulty with controlling rotational movement at relatively small ranges of motion.

Examples disclosed herein can control displacement (e.g., opening and closing) of a door (e.g., a ventilation door, an access door, etc.) relative to a frame (e.g., a chassis, a housing, etc.) without necessitating expensive and complex components. Further, examples can control movement of the door at relatively small angles. Examples disclosed herein utilize a first magnet on the frame or the door, and a magnet array including second and third magnets on a slide on the other of the frame or the door such that movement of the slide varies a force between the first magnet and the magnet array. According to examples disclosed herein, the magnet array repels the first magnet when the slide is moved to a first position along the path, thereby opening the door relative to the frame. Conversely, the magnet array can attract the first magnet when the slide is in a second position different from the first position, thereby closing, locking and/or constraining the door to the frame. In some examples, the door moves (e.g., pivots, rotates, etc.) relative to the frame and the force between the first magnet and the magnet array. In some examples, the force between the first magnet and the magnet array controls a degree of opening (e.g., an angle) between the frame and the door. and, thus, controls a displacement (e.g., an angular displacement, a pivoting displacement, a translational displacement, etc.) between the door and the frame. In particular, the first magnet or the magnet array can be positioned and/or supported by a body of the slide that moves along a path defined by a guide (e.g., a linear path of the guide). In some examples, an actuator moves the slide to control the angle between the frame and the door.

In some examples, the slide acts as a user-operated switch, toggle, latch and/or lever. In some such examples, movement of the slide to open the door causes the computing device to operate in a performance mode. In some examples, the door includes a Hall effect sensor for determining an opening or closing of the door. In some such examples, the Hall effect sensor is used to measure and/or detect a presence of a magnet mounted to the door. In some examples, an electromagnet or actuator can be implemented to cause movement of the slide by repelling or attracting a magnet on the slide to cause movement thereof.

In some examples, the door is a ventilation door (e.g., a cooling door) of a computing device, such as a desktop computer, a laptop computer, a tablet, a mobile phone, etc. In some such examples, an open/closed state of the ventilation door is controlled based on a measured thermal parameter (e.g., a temperature, a heat flux, etc.) of the computing device to control cooling thereof. Additionally or alternatively, a degree of opening between the ventilation door is based on the thermal parameter. In some examples, the slide defines a latch (e.g., a locking latch) between the frame and the door. In other words, the slide can lock and/or secure the door to the frame.

Figure 1B:
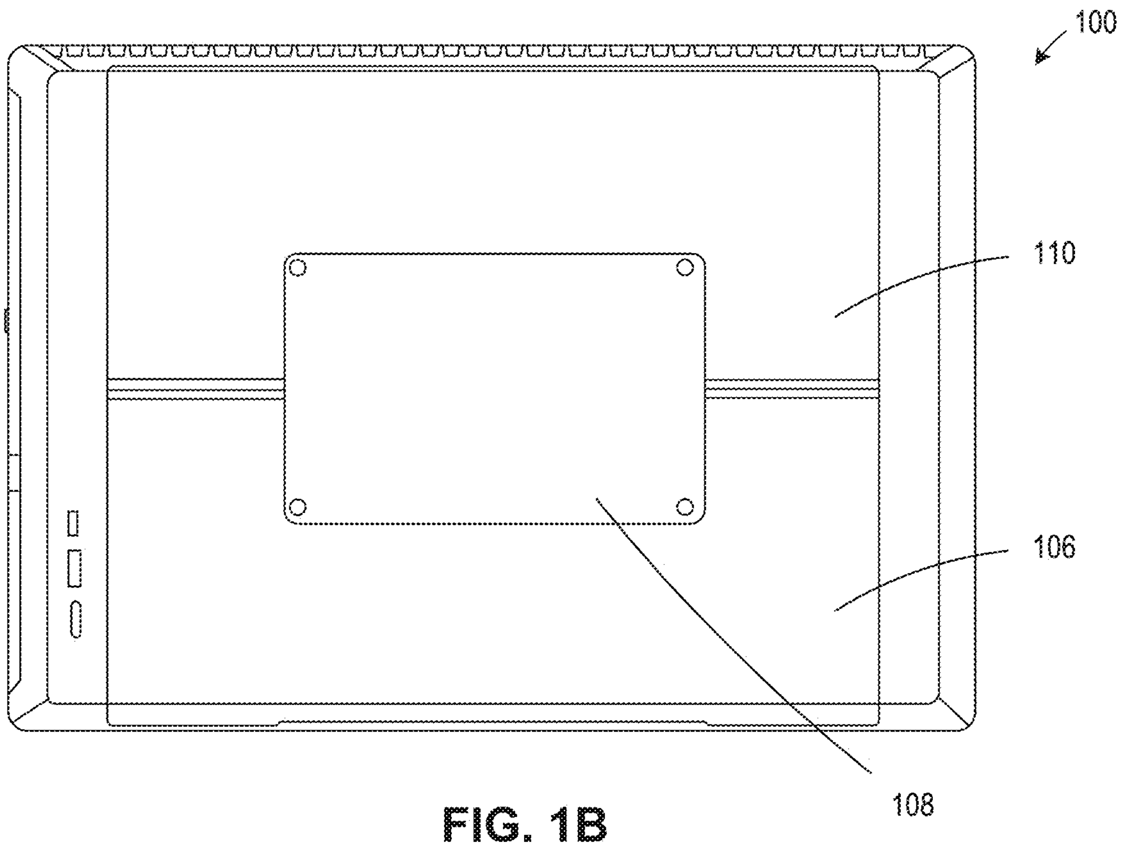

FIGS. 1A and 1B are front and rear views, respectively, of an example computing device 100 in accordance with teachings of this disclosure. Turning to FIG. 1A, a frontal view of the computing device 100 is shown. In this example, the computing device 100 is implemented as a tablet and includes a display 102 that is supported by a frame (e.g., a housing, a chassis, a case, etc.) 104. While the example computing device 100 is implemented as a tablet in this example, the computing device 100 can be implemented as any appropriate device, assembly and/or system including, but not limited to, a desktop computer, a mobile phone, a portable device, a gaming console, a set top box, etc.

Turning to FIG. 1B, a rear view of the computing device 100 is shown. In the illustrated example of FIG. 1B, the computing device 100 includes a kickstand 106, an access panel 108 and a door (e.g., an intake door) 110. In this example, the door 110 moves independently of the kickstand 106. In other examples, however, motion of the door 110 can at least be partially coupled to motion of the kickstand 106.

In operation, the intake door 110 moves relative to the frame 104 to vary a degree to which air or another cooling medium is to enter the computing device 100 via an opening (e.g., a ventilation opening) defined between the door 110 and the frame 104, as will be shown in greater detail below in connection with FIGS. 2-8. In other words, the door 110 is movably and/or rotatably coupled to the frame 104. As a result, cooling of the computing device 100 can be accurately controlled, thereby enabling increased computing performance (e.g., higher clock speeds) thereof. Additionally or alternatively, the intake door 110 is opened and/or displaced further from the frame 104 based on a user input (e.g., a user pushing a performance mode button of the computing device 100 or setting a mode of the computing device 100 in software executed thereby, etc.).

Further, the kickstand 106 moves relative to the frame 104 to enable the computing device 100 to be supported by a surface (e.g., a table surface). In some other examples, motion of the kickstand 106 is at least partially coupled with movement of the door 110. The coupled motion of the kickstand 106 and the door 110 can be accomplished by a linkage, gearing, etc. In some such examples, deployment of the kickstand 106 can result in the door 110 being moved to an open (or ventilation) position.

Figure 2:
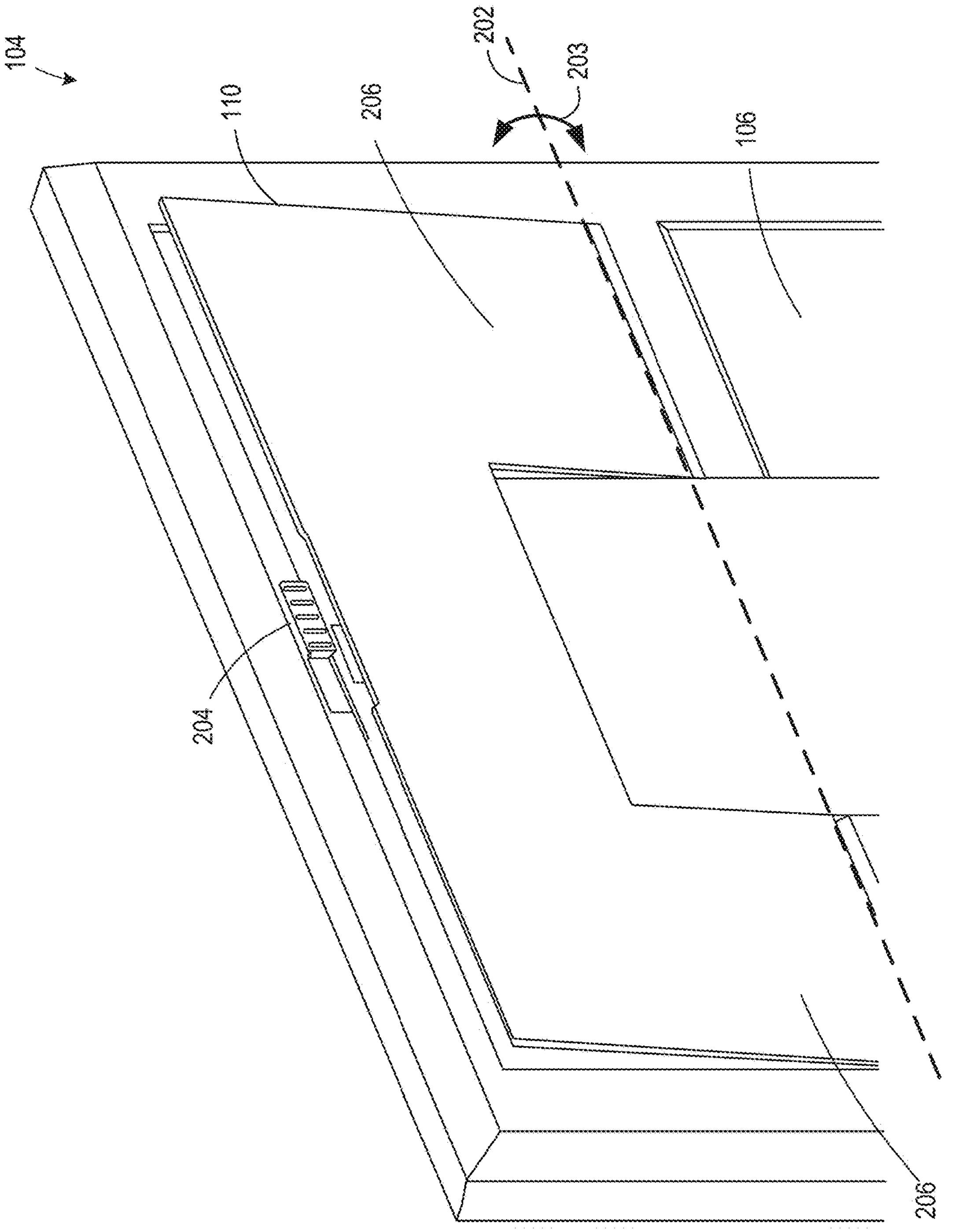
FIG. 2 is a detailed view of the example computing device of FIGS. 1A and 1B.

FIG. 2 is a detailed view of the example computing device 100 of FIG. 1. As can be seen in the illustrated example of FIG. 2, the door 110 pivots relative to the frame 104 about an axis of rotation 202, as generally indicated by a double arrow 203. Additionally or alternatively, the door 110 can translate and/or displace relative to the frame 104. In this example, the door 110 can be secured to (e.g., releasably coupled to, locked to, etc.) the frame 104 with a latch 204.

In this example, the door 110 is generally c-shaped to partially surround the access panel 108 such that the aforementioned axis of rotation 202 extends along separate portions (e.g., separate arms) 206 of the door 110 that are on opposing lateral sides of the access panel 108. Likewise, the kickstand 106 extends around the access panel 108 in a similar manner such that the kickstand 106 is also generally c-shaped. In this example, the kickstand 106 has an axis of rotation that is generally parallel to the axis of rotation 202 of the door 110.

Figure 3:
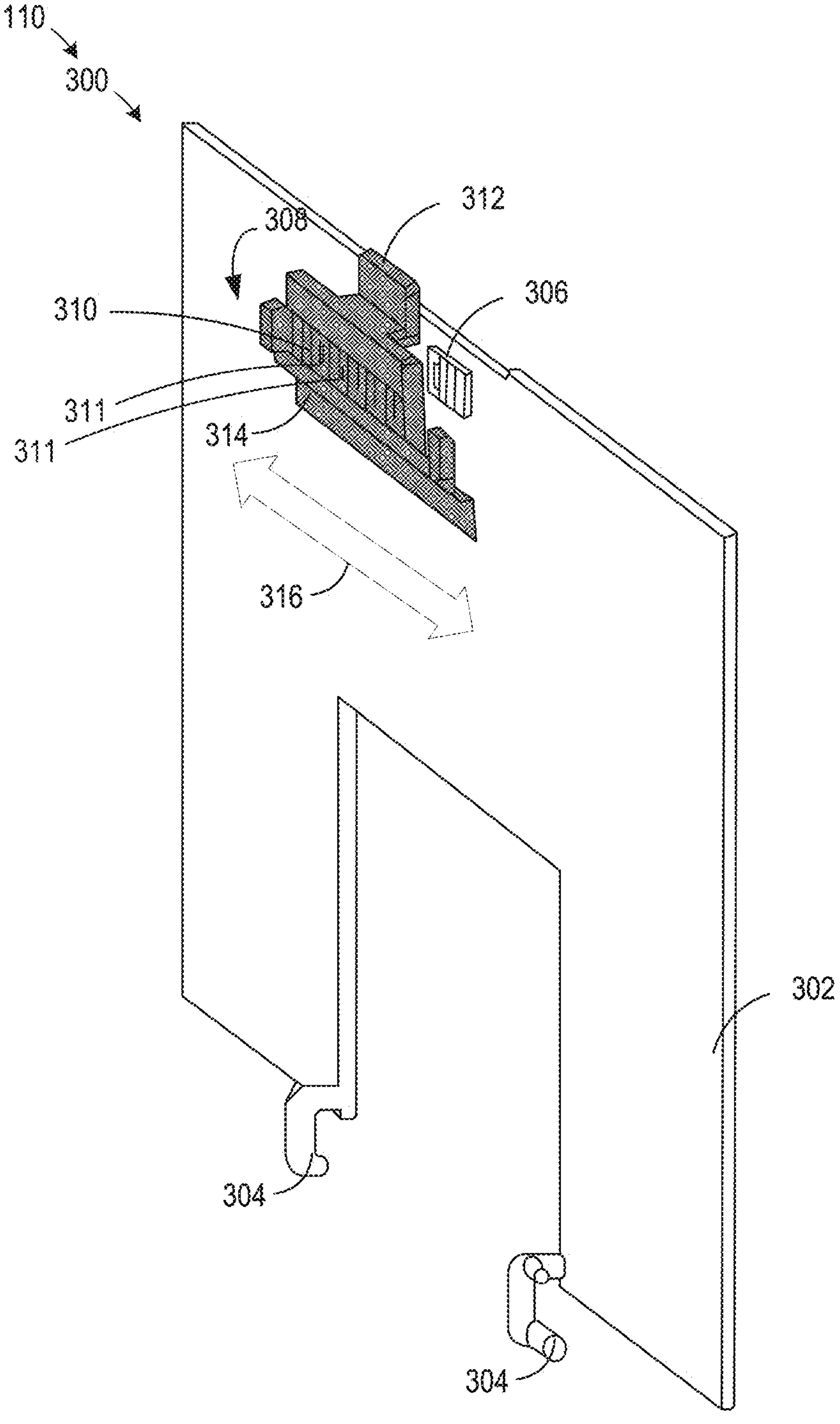
FIG. 3 illustrates an example door assembly of the example computing device of FIGS. 1A-2.

FIG. 3 illustrates an example door assembly 300 of the example door 110 of the example computing device 100 of FIG. 1. According to the illustrated example, the door assembly 300 includes a panel 302, pivot tabs 304 and a magnet 306. In this example, a slide 308 that carries and supports a magnet array 310 is positioned on the frame 104 (not shown in FIG. 3 for clarity) in this example, but shown for illustrative purposes. However, in other examples, the slide 308 and the magnet array 310 can be positioned on the door 110 while the magnet 306 is positioned on the frame 104. Thus, the slide 308 can be moved on the door 110 instead of the frame 104. In this example, the magnet array 310 includes magnets 311 that are positioned adjacent to one another and along a linear direction. In particular, the example magnet array 310 includes 3 magnets positioned along a lateral width of the frame 104 and/or the door 110. However, any appropriate number (e.g., two, five, ten, twenty, fifty, one hundred, etc.) of the magnets 311 can be implemented instead.

In the illustrated example of FIG. 3, to position and support the magnet array 310, the slide 308 includes a body 312. In turn, the example body 312 moves along a path defined by a guide 314 (e.g., moves in a sliding motion along the path defined by the guide 314). In this particular example, the guide 314 defines a linear path on which the slide 308 can move, as generally indicated by a double arrow 316. However, any other type of motion of the slide 308 can be implemented instead (e.g., curved motion, non-linear motion, etc.).

According to illustrated examples, the pivot tabs 304 are implemented to pivotably/rotatably couple and/or secure the door 110 to the frame 104. In particular, the example pivot tabs 304 position the door 110 and enable the door 110 to pivot about the axis of rotation 202 shown in FIG. 2. Additionally or alternatively, the door 110 can translate and/or displace.

In some examples, the slide 308 is implemented to function as a performance switch (e.g., an integrated performance switch). For example, a detected movement of the slide 308 (e.g., movement caused by a user of the computing device 100) can both cause at least a partial opening of the door 110 (e.g., open the door 110) and cause the computing device 100 to be operated in a performance mode (e.g., based on the detected movement and/or shift of the slide 308).

Figure 4:
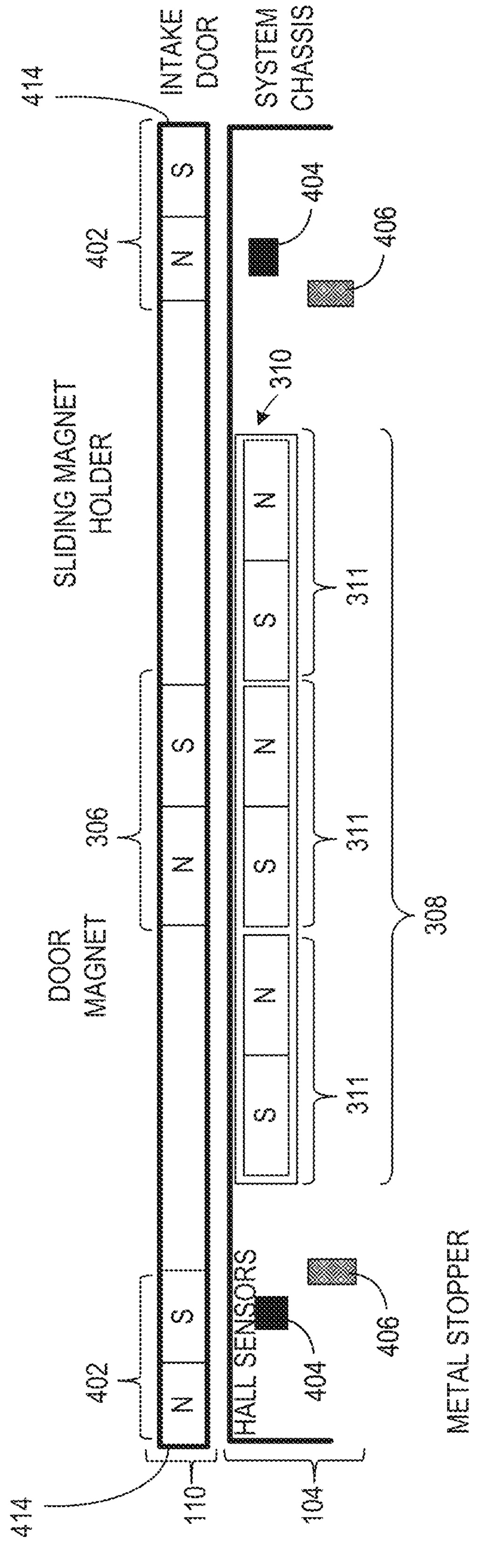
FIG. 4 illustrates an example magnet arrangement that can be implemented in examples disclosed herein.

FIG. 4 illustrates an example magnet arrangement that can be implemented in examples disclosed herein. The example magnet arrangement can be implemented in the computing device 100 shown in FIGS. 1A-3, for example. According to the illustrated example of FIG. 4, the magnet array 310 is positioned on the slide 308 which, in turn, is mounted to the frame 104. Further, the magnet array 310 (with the magnets 311) is shown on the slide 308 of the frame 104. Alternatively, the magnet array 310 and/or the slide 308 is positioned on the door 110 instead of the frame 104 and, in turn, the magnet 306 is positioned on the frame 104. In some examples, the slide 308 only includes one of the magnets 311 (e.g., the single magnet 311 is rotated to cause attraction or repulsion to the magnet 306).

In this example, the door 110 further includes magnets 402 positioned on opposing sides (e.g., opposing lateral sides) thereof. In particular, the magnets 402 can be positioned at or proximate lateral ends 414 of the door 110. In some examples, sensors 404 are implemented as Hall effect sensors. In some examples, the magnets 402 are detected by the respective sensors 404 for detection and/or determination that the door 110 is opened and/or closed. Further, example stops (e.g., metal stops, etc.) 406 are implemented to restrict movement of the slide 308.

As will be discussed in greater detail below in connection with FIGS. 5A-5C, at least the magnet array 310 moves along with the slide 308, thereby varying a force between the magnet 306 and the magnets 311 of the magnet array 310. In turn, based on the displacement of the slide 308 to a first location of a path of the slide 308, the door 110 is closed relative to the frame 104 (e.g., secured to the frame 104) based on an attractive force between the magnet 306 and the magnet array 310. Conversely, the slide 308 being at a second location of the aforementioned path causes the door 110 to open relative to the frame 104 based on a repulsive force between the magnet array 310 and the magnet 306. Additionally or alternatively, a degree (e.g., a rotational angle) to which door 110 is opened (e.g., pivoted, rotated, translated, displaced, etc.) relative to the frame 104 is controlled based on a relative motion of the slide 308 with the magnet array 310 to the magnet 306 along the path. In other words, a degree to which the door 110 is opened relative to the frame 104 can be controlled in some examples (e.g., the door 110 is controlled to be 60% opened, an angle of rotation of the door 110 is controlled, etc.).

Figure 5A:
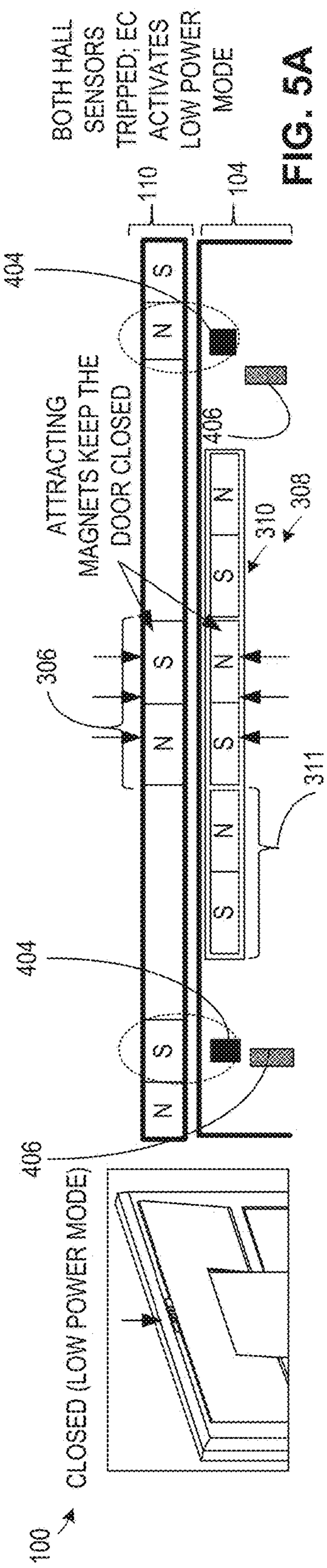
FIGS. 5A-5D illustrate example operating modes of the example magnet arrangement shown in FIG. 4.

FIGS. 5A-5D illustrate example operating modes of the example magnet arrangement shown in FIG. 4. Turning to FIG. 5A, the door 110 is in an example closed state relative to the frame 104. In particular, the example closed state corresponds to a low power mode (or power savings mode) of the computing device 100 of FIGS. 1A-4. In this example, the low power mode corresponds to reduced necessitated cooling of the computing device 100 due to its lower power dissipation.

In this example closed state, the magnet 306 and the magnet array 310 are attracted to each other, thereby holding the door 110 to the frame 104. In some examples, attraction of the slide 308 to the magnet array 310 causes the slide 308 to be centered relative to the opposing stops 406 and/or an overall width of the frame 104. Further, in this example, both of the sensors 404 are tripped and, thus, the computing device 100 is maintained in the low power mode.

Figure 5B:
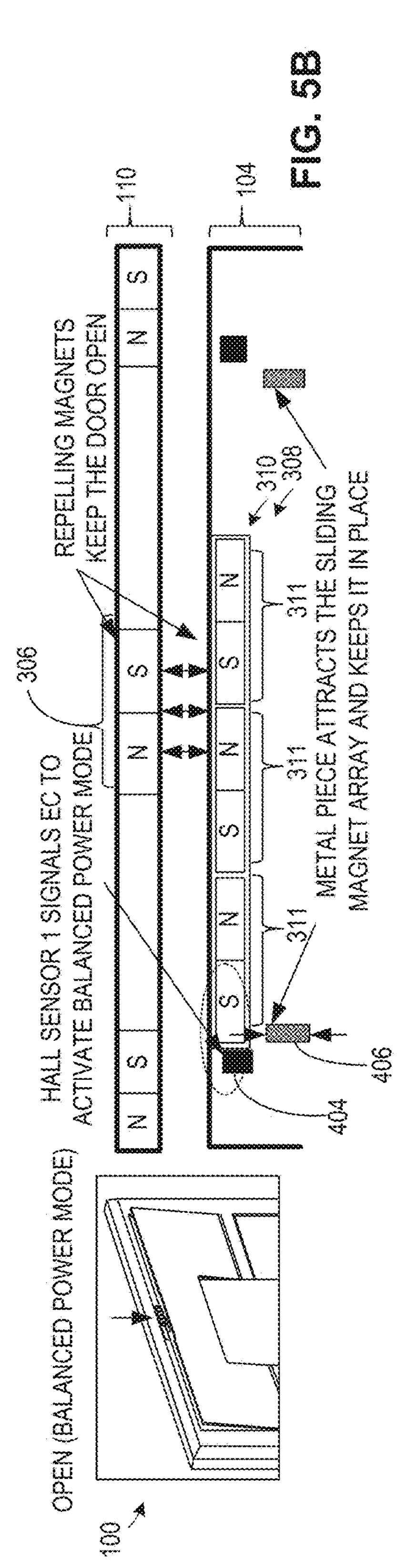

FIG. 5B depicts an example open state of the door 110 that corresponds to a balanced power mode of the computing device 100. In this example, the relative positioning of the slide 308 (supporting the magnet array 310) to the magnet 306 causes the magnet 306 and at least one of the magnets 311 of the magnet array 310 to repel one another. As a result, the door 110 is opened relative to (e.g., pivoted outward from) the frame 104. In this example, the sensor 404 to the left of the slide 308 (in the view of FIG. 5B) detects that the slide 308 is in proximity thereto and signals the computing device 100 to be in the balanced power mode. Further, the slide 308 is moved toward the stop 406 on the left (in the view of FIG. 5B) until it is restricted from further movement. In some examples, the stop 406 attracts the magnet array 310.

Figure 5C:
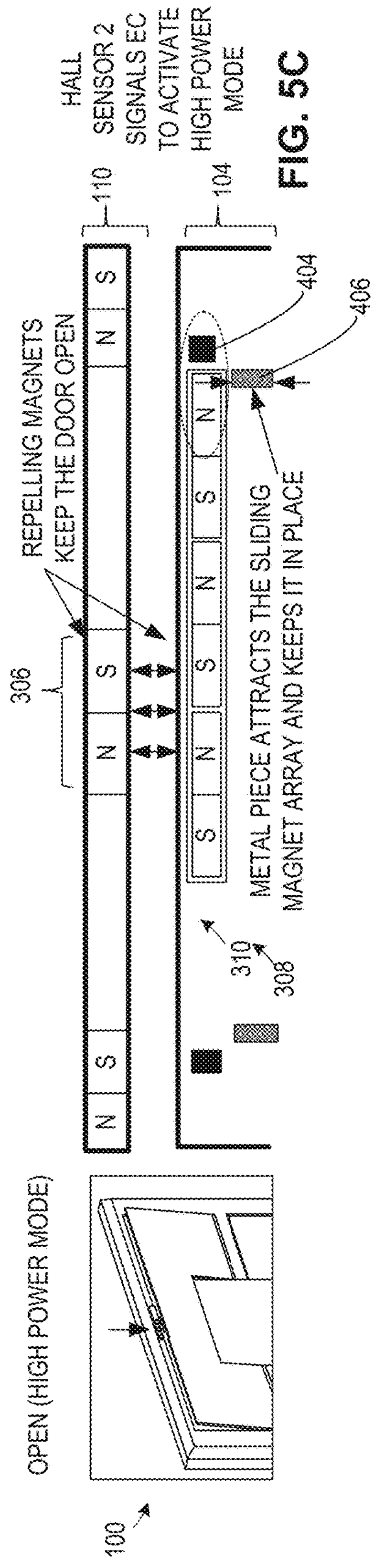

Turning to FIG. 5C, another example open state of the door 110 is shown. The example open state of the door 110 shown in FIG. 5C corresponds to a high power mode (e.g., a performance mode, a gaming mode, etc.) of the computing device 100. In the illustrated example of FIG. 5C, the door 110 is shown with the slide 308 moved toward an opposite side (e.g., an opposite lateral side) to that shown in FIG. 5B. In this example, the movement of the slide 308 causes the magnet 306 to be repelled by the magnet array 310 of the slide 308 and, thus, the door 110 remains open relative to the frame 104. Moreover, the slide 308 is moved toward the stop 406 on the right side of the slide 308 (in the view of FIG. 5B) while the sensor 404 closer to the slide 308 (in the view of FIG. 5B) detects a close proximity or presence of the slide 308 and/or the at least one of the magnets 311.

Figure 5D:
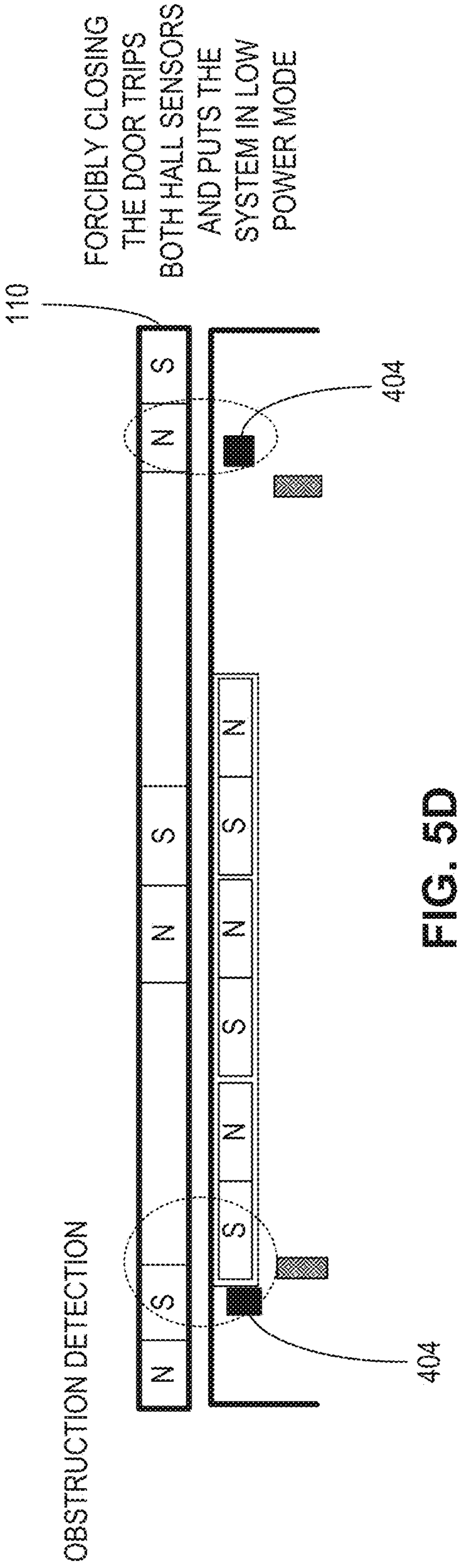

FIG. 5D depicts the door 110 in a state where obstructions are detected. In this example, forcibly closing the door 110 trips both of the sensors 404, thereby causing the computing device 100 to be placed into the lower power mode.

Figure 6:
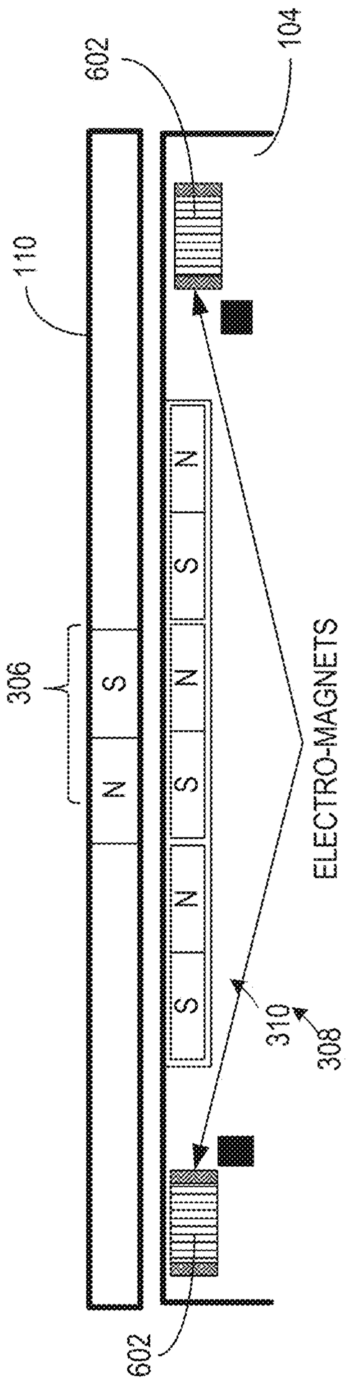
FIG. 6 depicts another example magnet arrangement that can be implemented in examples disclosed herein.

FIG. 6 depicts another example magnet arrangement that can be implemented in examples disclosed herein. The example magnet arrangement depicted in FIG. 6 is similar to that shown in FIGS. 4-5D, but, instead, includes at least one electromagnet 602. In this example, two laterally opposing ones of the electromagnets 602 are implemented to move the slide 308. In some examples, each of the electromagnets 602 is charged and/or powered to repel and/or attract the slide 308, thereby causing the door 110 to displace relative to the frame 104 due to forces between the magnet array 310 and the magnet 306. In some such examples, the electromagnets 602 also act as physical stops and/or restraints for the slide 308.

Figure 7:
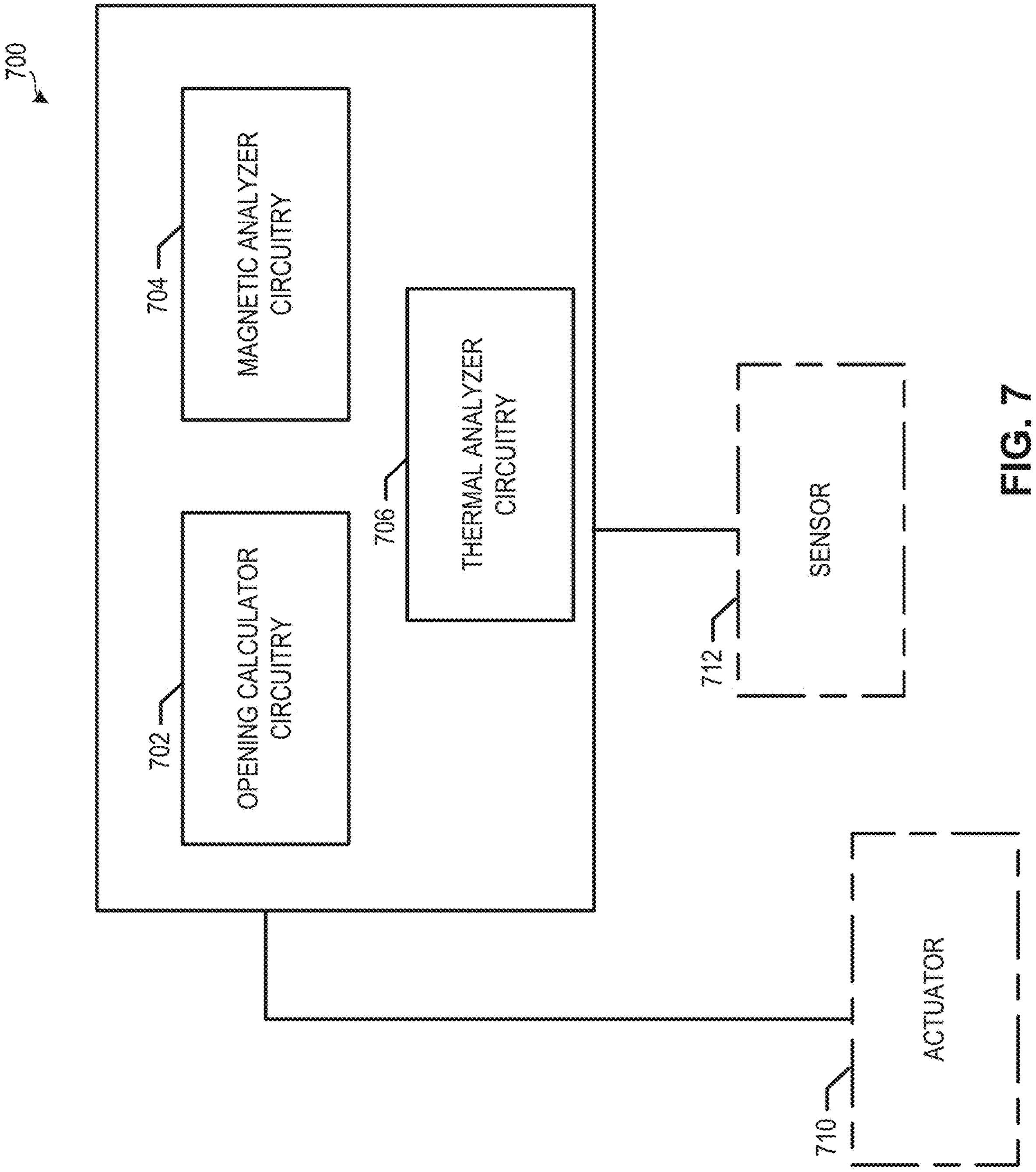
FIG. 7 is a block diagram of an example door analyzer that can be implemented in examples disclosed herein.

FIG. 7 is a block diagram of an example door analyzer 700 to control movement of a ventilation door, such as the example door 110. The example door analyzer 700 of FIG. 7 may be instantiated (e.g., creating an instance of, bring into being for any length of time, materialize, implement, etc.) by processor circuitry such as a central processing unit executing instructions. Additionally or alternatively, the example door analyzer 700 of FIG. 7 may be instantiated (e.g., creating an instance of, bring into being for any length of time, materialize, implement, etc.) by an ASIC or an FPGA structured to perform operations corresponding to the instructions. It should be understood that some or all of the circuitry of FIG. 7 may, thus, be instantiated at the same or different times. Some or all of the circuitry may be instantiated, for example, in one or more threads executing concurrently on hardware and/or in series on hardware. Moreover, in some examples, some or all of the circuitry of FIG. 7 may be implemented by one or more virtual machines and/or containers executing on the microprocessor.

In the illustrated example, the door analyzer 700 includes example opening calculator circuitry 702, example magnetic analyzer circuitry 704, and example thermal analyzer circuitry 706. In some examples, the door analyzer 700 includes and/or is communicatively coupled to an actuator 710, which can be implemented to move, rotate and/or displace the slide 308 and/or the door 110. Additionally or alternatively, the example door analyzer 700 is communicatively coupled to a sensor (e.g., a thermal sensor, a temperature sensor, a current sensor for power dissipation calculations, etc.) 712, which can be positioned within the computing device 100.

The opening calculator circuitry 702 of the illustrated example determines whether to place the door 110 in the open or closed state. This determination may be based on an operating mode of the computing device 100 and/or a measured thermal parameter (e.g., a temperature, a power usage level, a power draw, etc.) of and/or within the computing device 100. In other words, the door 110 can be opened or closed relative to the frame 104 for controlling thermal performance characteristics of the computing device 100. Additionally or alternatively, the opening calculator circuitry 702 determines a degree to which the door 110 is to be opened and/or displaced relative to the frame 104 (e.g., a desired ventilation opening between the door 110 and the frame 104). In some particular examples, the opening calculator circuitry 702 calculates a set or desired rotational angle (e.g., a pivot angle) of the door 110 relative to the frame 104 (e.g., a set point of the rotational angle of the door 110 relative to the frame 104).

The example magnetic analyzer circuitry 704 determines and/or calculates a presence and/or location of magnets (e.g., the magnets 306, 311, 402, etc.) associated with the door 110. In some examples, the example magnetic analyzer circuitry 704 determines and/or analyzes measured magnetic fields associated with the aforementioned magnets. Additionally or alternatively, the example magnetic analyzer circuitry 704 determines and/or characterizes a degree of force (e.g., electromotive force, etc.) necessary to move and/or displace the slide 308. In some examples, the magnetic analyzer circuitry 704 calculates and/or characterizes expected magnetic fields and/or forces based on a configuration of magnets associated with the door 110.

The example thermal analyzer circuitry 706 determines a thermal parameter and/or a thermal mode setting (e.g., a performance mode, a balanced mode, a low power mode, etc.) associated with the computing device 100. In some examples, the thermal parameter corresponds to a measured temperature and/or heat flux measured by the example sensor 712. In particular, the thermal parameter can corresponds to a measured internal temperature of the computing device 100, such as a measured internal ambient temperature or a temperature of a component (e.g., a measured processor die temperature, a measured board temperature, a junction temperature, etc.) measured by the sensor 712. In other words, movement and/or an opening state of the door 110 can be adjusted based on desired cooling of the computing device 100.

While an example manner of implementing the door analyzer 700 of FIG. 7 is illustrated in FIG. 7, one or more of the elements, processes, and/or devices illustrated in FIG. 7 may be combined, divided, re-arranged, omitted, eliminated, and/or implemented in any other way. Further, the example opening calculator circuitry 702, example magnetic analyzer circuitry 704, and example thermal analyzer circuitry 706, and/or, more generally, the example door analyzer 700 of FIG. 7, may be implemented by hardware alone or by hardware in combination with software and/or firmware. Thus, for example, any of the example opening calculator circuitry 702, example magnetic analyzer circuitry 704, and example thermal analyzer circuitry 706, and/or, more generally, the example door analyzer 700, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). Further still, the example door analyzer 700 of FIG. 7 may include one or more elements, processes, and/or devices in addition to, or instead of, those illustrated in FIG. 7, and/or may include more than one of any or all of the illustrated elements, processes and devices.

Figure 8:
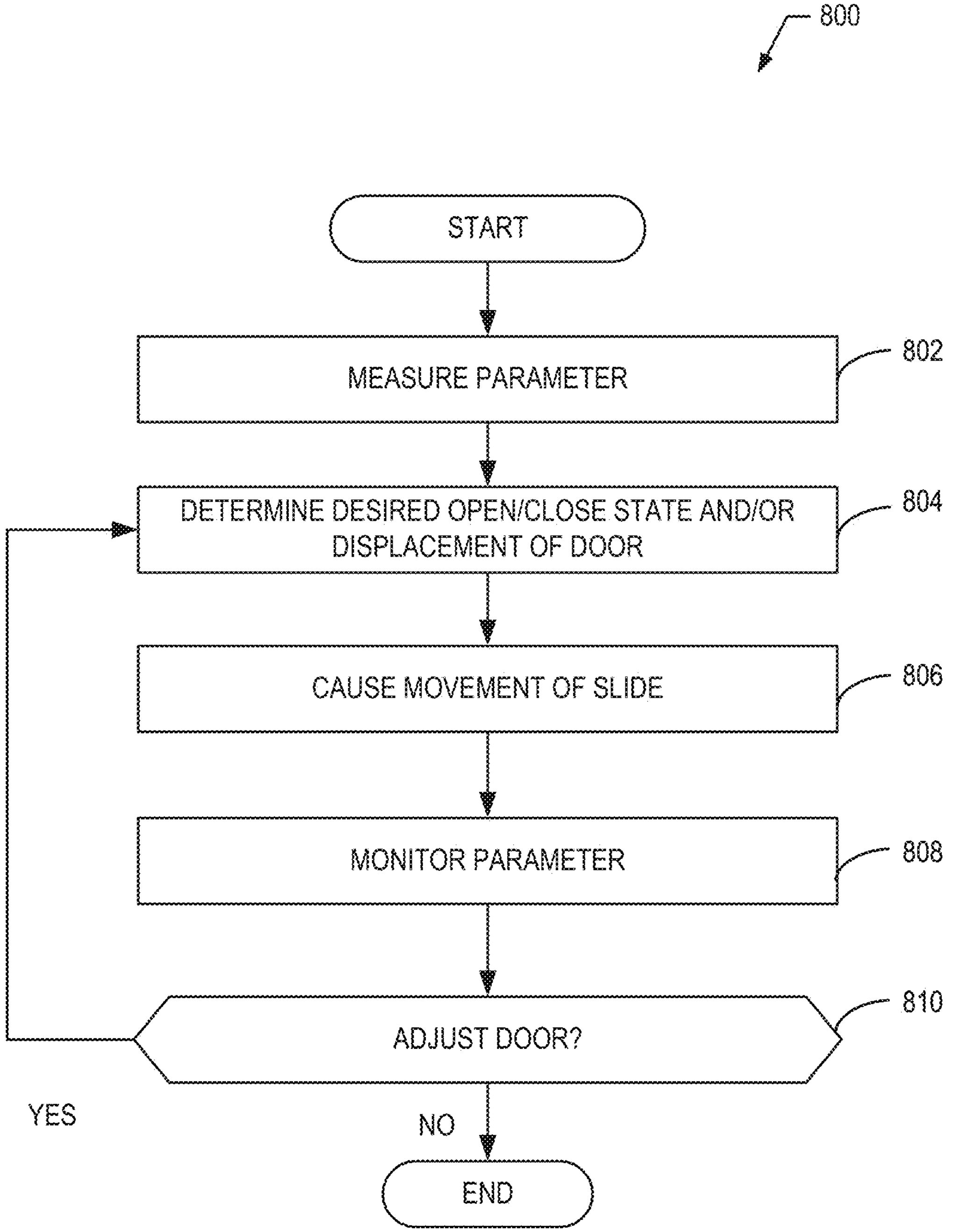
FIG. 8 is a flowchart representative of example machine readable instructions and/or example operations that may be executed by example processor circuitry to implement the example computing device of FIGS. 1A and 1B and/or the example door analyzer of FIG. 7.

A flowchart representative of example hardware logic circuitry, machine readable instructions, hardware implemented state machines, and/or any combination thereof for implementing the door analyzer 700 of FIG. 7 is shown in FIG. 8. The machine readable instructions may be one or more executable programs or portion(s) of an executable program for execution by processor circuitry, such as the processor circuitry 912 shown in the example processor platform 900 discussed below in connection with FIG. 9 and/or the example processor circuitry discussed below in connection with FIGS. 10 and/or 11. The program may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN)) gateway that may facilitate communication between a server and an endpoint client hardware device). Similarly, the non-transitory computer readable storage media may include one or more mediums located in one or more hardware devices. Further, although the example program is described with reference to the flowchart illustrated in FIG. 8, many other methods of implementing the example door analyzer 700 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU), etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIG. 8 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium and non-transitory computer readable storage medium are expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 8 is a flowchart representative of example machine readable instructions and/or example operations 800 that may be executed and/or instantiated by processor circuitry to control and/or direct operation of the door 110. The machine readable instructions and/or the operations 800 of FIG. 8 begin at block 802, at which the thermal analyzer circuitry 706 causes the sensor 712 to measure at least one parameter (e.g., a thermal parameter, a temperature, a heat flux, a power usage, etc.) associated with the computing device 100.

At block 804, the example opening calculator circuitry 702 determines an open/closed state and/or displacement of the door 110 (e.g., a desired open/closed state of the door 110). In some examples, the opening calculator circuitry 702 determines a desired opening angle of the door 110. In some examples, the example opening calculator circuitry 702 determines a desired displacement of the door 110 and/or whether the door 110 is to be opened or closed based on an operating mode of the computing device 100 and/or information (e.g., temperature data, power usage, etc.) measured by the sensor 712, for example.

At block 806, in some examples, the magnetic analyzer circuitry 704 causes movement of the slide 308. In some such examples, the magnetic analyzer circuitry 704 causes the actuator 710 to move the slide 308. Additionally or alternatively, the magnetic analyzer circuitry 704 controls the electromagnet 602 to move the slide 308.

At block 808, the thermal analyzer circuitry 706 of the illustrated example causes the sensor 712 to monitor and/or measure the parameter. In this example, an internal ambient temperature or device temperature of the computing device 100 is measured by the sensor 712.

At block 810, it is determined whether to adjust the open/closed state and/or displacement of the door 110 by the example thermal analyzer circuitry 706. If the door is to be adjusted (block 810), control of the process returns to block 804. Otherwise, the process ends.

Figure 9:
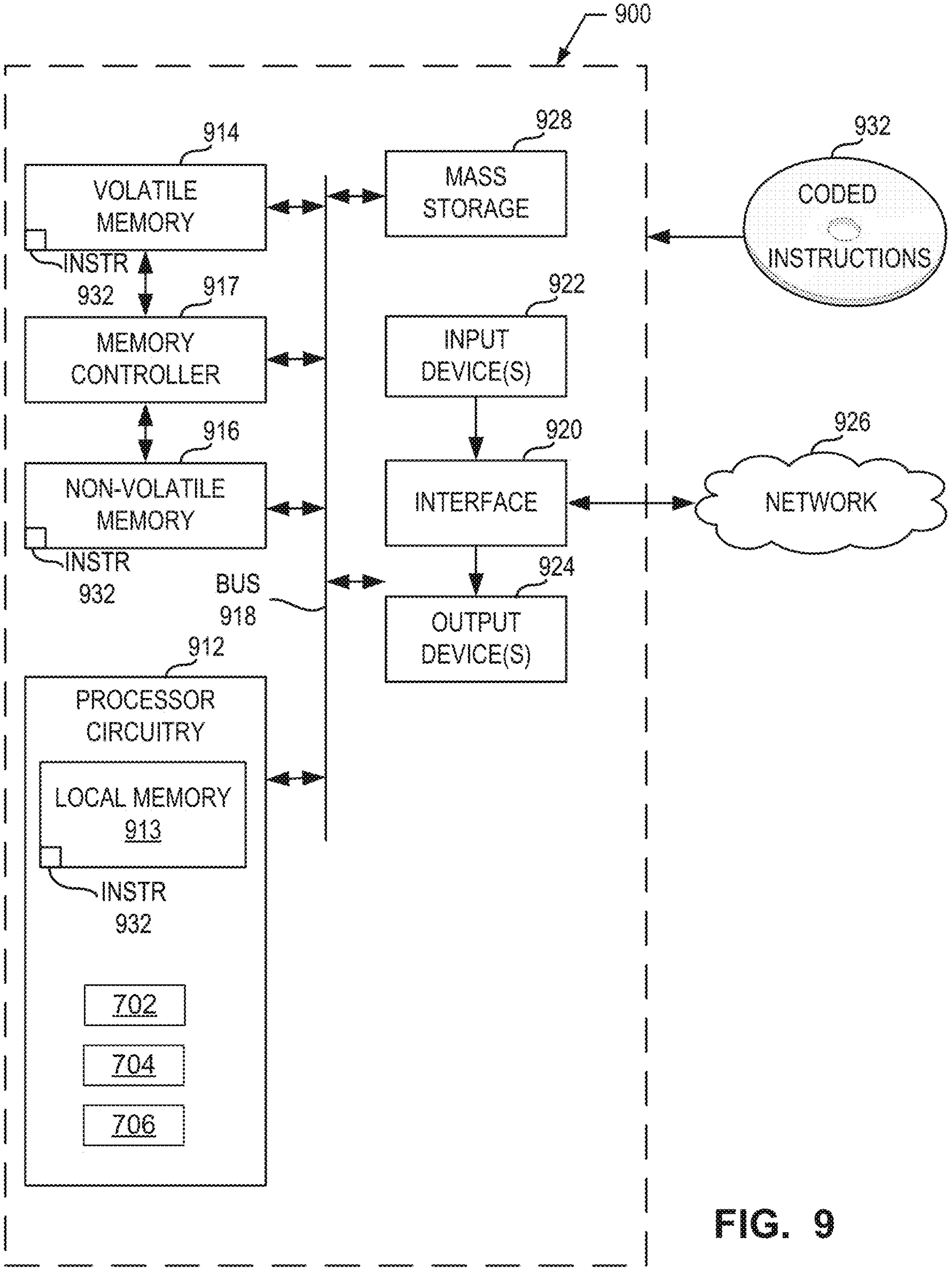
FIG. 9 is a block diagram of an example processing platform including processor circuitry structured to execute the example machine readable instructions and/or the example operations of FIG. 8 to implement the example computing device of FIGS. 1A and 1B and/or the example door analyzer of FIG. 7.

FIG. 9 is a block diagram of an example processor platform 900 structured to execute and/or instantiate the machine readable instructions and/or the operations of FIG. 8 to implement the example key analyzer 700 of FIG. 7. The processor platform 900 can be, for example, a server, a personal computer, a workstation, a self-learning machine (e.g., a neural network), a mobile device (e.g., a cell phone, a smart phone, a tablet such as an iPad), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 900 of the illustrated example includes processor circuitry 912. The processor circuitry 912 of the illustrated example is hardware. For example, the processor circuitry 912 can be implemented by one or more integrated circuits, logic circuits, FPGAs, microprocessors, CPUs, GPUs, DSPs, and/or microcontrollers from any desired family or manufacturer. The processor circuitry 912 may be implemented by one or more semiconductor based (e.g., silicon based) devices. In this example, the processor circuitry 912 implements the example opening calculator circuitry 702, the example magnetic analyzer circuitry 704, and the example thermal analyzer circuitry 706.

The processor circuitry 912 of the illustrated example includes a local memory 913 (e.g., a cache, registers, etc.). The processor circuitry 912 of the illustrated example is in communication with a main memory including a volatile memory 914 and a non-volatile memory 916 by a bus 918. The volatile memory 914 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 916 may be implemented by flash memory and/or any other desired type of memory device. Access to the main memory 914, 916 of the illustrated example is controlled by a memory controller 917.

The processor platform 900 of the illustrated example also includes interface circuitry 920. The interface circuitry 920 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 922 are connected to the interface circuitry 920. The input device(s) 922 permit(s) a user to enter data and/or commands into the processor circuitry 912. The input device(s) 922 can be implemented by, for example, an audio sensor, a microphone, a camera (still or video), a keyboard, a button, a mouse, a touchscreen, a track-pad, a trackball, an isopoint device, and/or a voice recognition system.

One or more output devices 924 are also connected to the interface circuitry 920 of the illustrated example. The output device(s) 924 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 920 of the illustrated example, thus, typically includes a graphics driver card, a graphics driver chip, and/or graphics processor circuitry such as a GPU.

The interface circuitry 920 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 926. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 900 of the illustrated example also includes one or more mass storage devices 928 to store software and/or data. Examples of such mass storage devices 928 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine executable instructions 932, which may be implemented by the machine readable instructions of FIG. 8, may be stored in the mass storage device 928, in the volatile memory 914, in the non-volatile memory 916, and/or on a removable non-transitory computer readable storage medium such as a CD or DVD.

Figure 10:
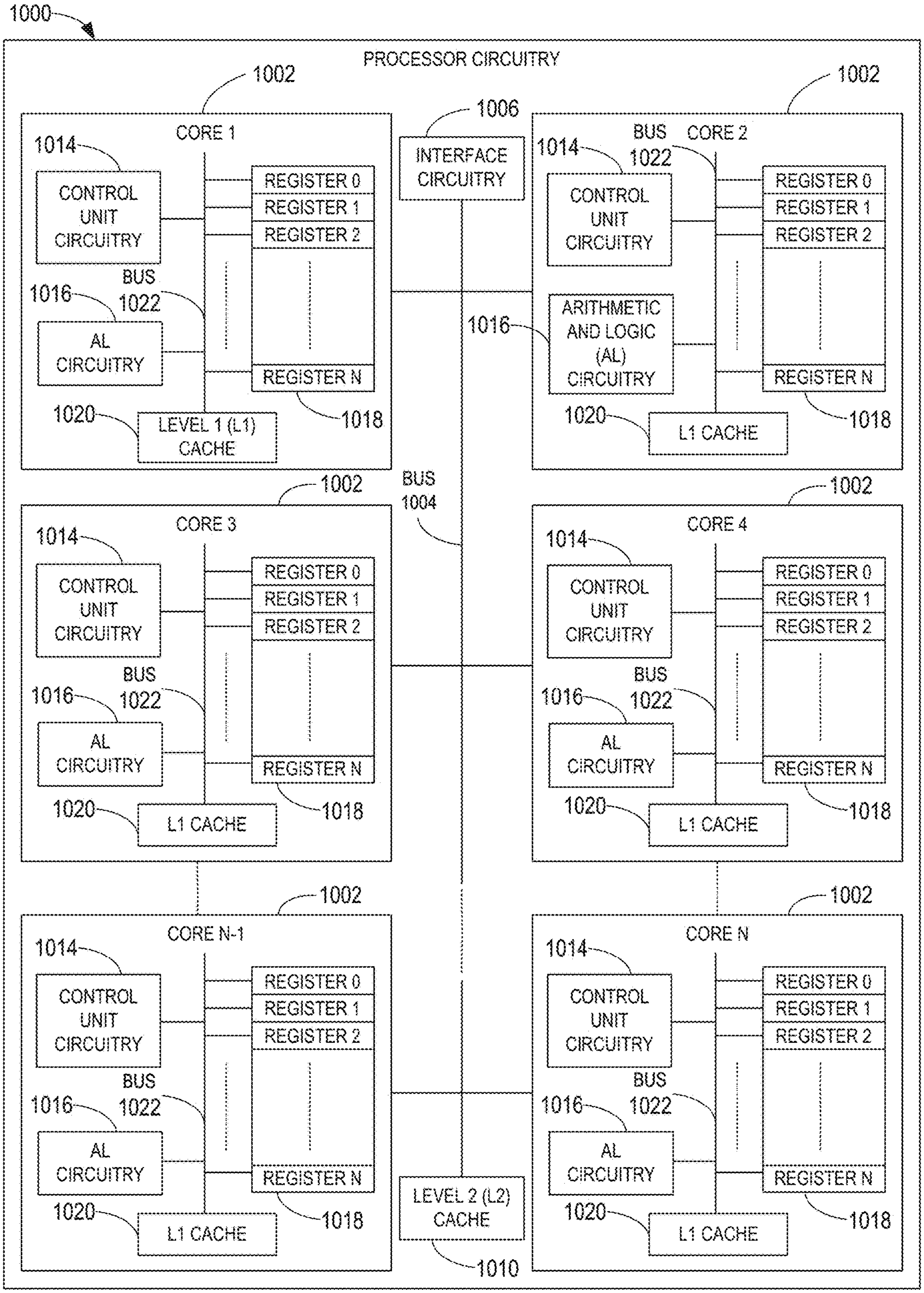
FIG. 10 is a block diagram of an example implementation of the processor circuitry of FIG. 9.

FIG. 10 is a block diagram of an example implementation of the processor circuitry 912 of FIG. 9. In this example, the processor circuitry 912 of FIG. 9 is implemented by a general purpose microprocessor 1000. The general purpose microprocessor circuitry 1000 executes some or all of the machine readable instructions of the flowchart of FIG. 9 to effectively instantiate the circuitry of FIG. 2 as logic circuits to perform the operations corresponding to those machine readable instructions. In some such examples, the circuitry of FIG. 7 is instantiated by the hardware circuits of the microprocessor 1000 in combination with the instructions. For example, the microprocessor 1000 may implement multi-core hardware circuitry such as a CPU, a DSP, a GPU, an XPU, etc. Although it may include any number of example cores 1002 (e.g., 1 core), the microprocessor 1000 of this example is a multi-core semiconductor device including N cores. The cores 1002 of the microprocessor 1000 may operate independently or may cooperate to execute machine readable instructions. For example, machine code corresponding to a firmware program, an embedded software program, or a software program may be executed by one of the cores 1002 or may be executed by multiple ones of the cores 1002 at the same or different times. In some examples, the machine code corresponding to the firmware program, the embedded software program, or the software program is split into threads and executed in parallel by two or more of the cores 1002. The software program may correspond to a portion or all of the machine readable instructions and/or operations represented by the flowchart of FIG. 8.

The cores 1002 may communicate by a first example bus 1004. In some examples, the first bus 1004 may implement a communication bus to effectuate communication associated with one(s) of the cores 1002. For example, the first bus 1004 may implement at least one of an Inter-Integrated Circuit (I2C) bus, a Serial Peripheral Interface (SPI) bus, a PCI bus, or a PCIe bus. Additionally or alternatively, the first bus 1004 may implement any other type of computing or electrical bus. The cores 1002 may obtain data, instructions, and/or signals from one or more external devices by example interface circuitry 1006. The cores 1002 may output data, instructions, and/or signals to the one or more external devices by the interface circuitry 1006. Although the cores 1002 of this example include example local memory 1020 (e.g., Level 1 (L1) cache that may be split into an L1 data cache and an L1 instruction cache), the microprocessor 1000 also includes example shared memory 1010 that may be shared by the cores (e.g., Level 2 (L2_cache)) for high-speed access to data and/or instructions. Data and/or instructions may be transferred (e.g., shared) by writing to and/or reading from the shared memory 1010. The local memory 1020 of each of the cores 1002 and the shared memory 1010 may be part of a hierarchy of storage devices including multiple levels of cache memory and the main memory (e.g., the main memory 914, 916 of FIG. 9). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1002 may be referred to as a CPU, DSP, GPU, etc., or any other type of hardware circuitry. Each core 1002 includes control unit circuitry 1014, arithmetic and logic (AL) circuitry (sometimes referred to as an ALU) 1016, a plurality of registers 1018, the L1 cache 1020, and a second example bus 1022. Other structures may be present. For example, each core 1002 may include vector unit circuitry, single instruction multiple data (SIMD) unit circuitry, load/store unit (LSU) circuitry, branch/jump unit circuitry, floating-point unit (FPU) circuitry, etc. The control unit circuitry 1014 includes semiconductor-based circuits structured to control (e.g., coordinate) data movement within the corresponding core 1002. The AL circuitry 1016 includes semiconductor-based circuits structured to perform one or more mathematic and/or logic operations on the data within the corresponding core 1002. The AL circuitry 1016 of some examples performs integer based operations. In other examples, the AL circuitry 1016 also performs floating point operations. In yet other examples, the AL circuitry 1016 may include first AL circuitry that performs integer based operations and second AL circuitry that performs floating point operations. In some examples, the AL circuitry 1016 may be referred to as an Arithmetic Logic Unit (ALU). The registers 1018 are semiconductor-based structures to store data and/or instructions such as results of one or more of the operations performed by the AL circuitry 1016 of the corresponding core 1002. For example, the registers 1018 may include vector register(s), SIMD register(s), general purpose register (s), flag register(s), segment register(s), machine specific register(s), instruction pointer register(s), control register(s), debug register(s), memory management register(s), machine check register(s), etc. The registers 1018 may be arranged in a bank as shown in FIG. 10. Alternatively, the registers 1018 may be organized in any other arrangement, format, or structure including distributed throughout the core 1002 to shorten access time. The second bus 1022 may implement at least one of an I2C bus, a SPI bus, a PCI bus, or a PCIe bus Each core 1002 and/or, more generally, the microprocessor 1000 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1000 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 11:
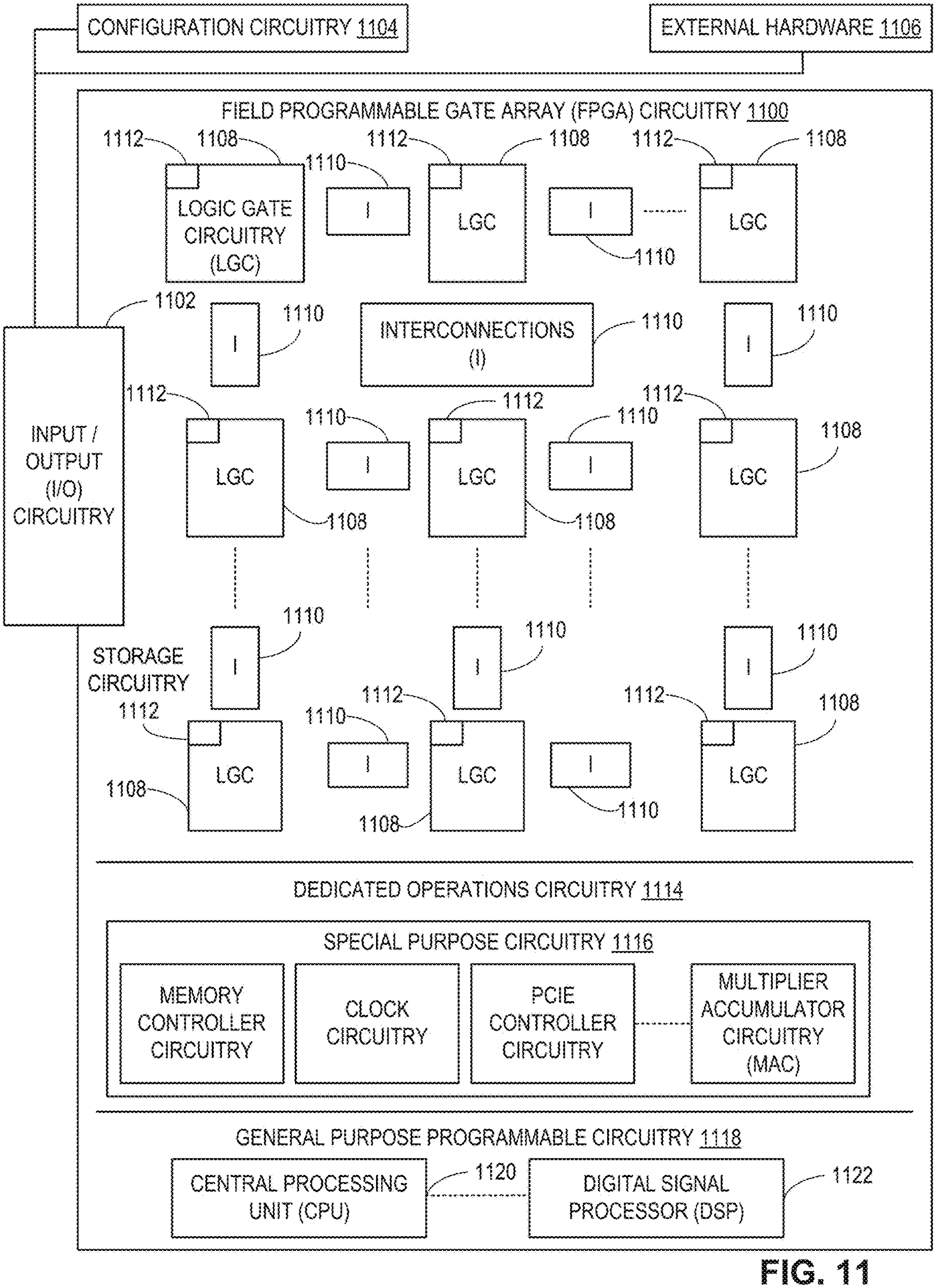
FIG. 11 is a block diagram of another example implementation of the processor circuitry of FIG. 9.

FIG. 11 is a block diagram of another example implementation of the processor circuitry 912 of FIG. 9. In this example, the processor circuitry 912 is implemented by FPGA circuitry 1100. The FPGA circuitry 1100 can be used, for example, to perform operations that could otherwise be performed by the example microprocessor 1000 of FIG. 10 executing corresponding machine readable instructions. However, once configured, the FPGA circuitry 1100 instantiates the machine readable instructions in hardware and, thus, can often execute the operations faster than they could be performed by a general purpose microprocessor executing the corresponding software.

More specifically, in contrast to the microprocessor 1000 of FIG. 10 described above (which is a general purpose device that may be programmed to execute some or all of the machine readable instructions represented by the flowchart of FIG. 8 but whose interconnections and logic circuitry are fixed once fabricated), the FPGA circuitry 1100 of the example of FIG. 6 includes interconnections and logic circuitry that may be configured and/or interconnected in different ways after fabrication to instantiate, for example, some or all of the machine readable instructions represented by the flowchart of FIG. 8. In particular, the FPGA 1100 may be thought of as an array of logic gates, interconnections, and switches. The switches can be programmed to change how the logic gates are interconnected by the interconnections, effectively forming one or more dedicated logic circuits (unless and until the FPGA circuitry 1100 is reprogrammed). The configured logic circuits enable the logic gates to cooperate in different ways to perform different operations on data received by input circuitry. Those operations may correspond to some or all of the software represented by the flowchart of FIG. 8. As such, the FPGA circuitry 1100 may be structured to effectively instantiate some or all of the machine readable instructions of the flowchart of FIG. 8 as dedicated logic circuits to perform the operations corresponding to those software instructions in a dedicated manner analogous to an ASIC. Therefore, the FPGA circuitry 1100 may perform the operations corresponding to the some or all of the machine readable instructions of FIG. 8 faster than the general purpose microprocessor can execute the same.

In the example of FIG. 11, the FPGA circuitry 1100 is structured to be programmed (and/or reprogrammed one or more times) by an end user by a hardware description language (HDL) such as Verilog. The FPGA circuitry 1100 of FIG. 11, includes example input/output (I/O) circuitry 1102 to obtain and/or output data to/from example configuration circuitry 1104 and/or external hardware (e.g., external hardware circuitry) 1106. For example, the configuration circuitry 1104 may implement interface circuitry that may obtain machine readable instructions to configure the FPGA circuitry 1100, or portion(s) thereof. In some such examples, the configuration circuitry 1104 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 1106 may implement the microprocessor 1000 of FIG. 10. The FPGA circuitry 1100 also includes an array of example logic gate circuitry 1108, a plurality of example configurable interconnections 1110, and example storage circuitry 1112. The logic gate circuitry 1108 and interconnections 1110 are configurable to instantiate one or more operations that may correspond to at least some of the machine readable instructions of FIG. 8 and/or other desired operations. The logic gate circuitry 1108 shown in FIG. 11 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1108 to enable configuration of the electrical structures and/or the logic gates to form circuits to perform desired operations. The logic gate circuitry 1108 may include other electrical structures such as look-up tables (LUTs), registers (e.g., flip-flops or latches), multiplexers, etc.

The interconnections 1110 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1108 to program desired logic circuits.

The storage circuitry 1112 of the illustrated example is structured to store result(s) of the one or more of the operations performed by corresponding logic gates. The storage circuitry 1112 may be implemented by registers or the like. In the illustrated example, the storage circuitry 1112 is distributed amongst the logic gate circuitry 1108 to facilitate access and increase execution speed.

The example FPGA circuitry 1100 of FIG. 11 also includes example Dedicated Operations Circuitry 1114. In this example, the Dedicated Operations Circuitry 1114 includes special purpose circuitry 1116 that may be invoked to implement commonly used functions to avoid the need to program those functions in the field. Examples of such special purpose circuitry 1116 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1100 may also include example general purpose programmable circuitry 1118 such as an example CPU 1120 and/or an example DSP 1122. Other general purpose programmable circuitry 1118 may additionally or alternatively be present such as a GPU, an XPU, etc., that can be programmed to perform other operations.

Although FIGS. 10 and 11 illustrate two example implementations of the processor circuitry 912 of FIG. 9, many other approaches are contemplated. For example, as mentioned above, modern FPGA circuitry may include an on-board CPU, such as one or more of the example CPU 1120 of FIG. 11. Therefore, the processor circuitry 912 of FIG. 9 may additionally be implemented by combining the example microprocessor 1000 of FIG. 10 and the example FPGA circuitry 1100 of FIG. 11. In some such hybrid examples, a first portion of the machine readable instructions represented by the flowchart of FIG. 8 may be executed by one or more of the cores 1002 of FIG. 10, a second portion of the machine readable instructions represented by the flowchart of FIG. 8 may be executed by the FPGA circuitry 1100 of FIG. 11, and/or a third portion of the machine readable instructions represented by the flowchart of FIG. 8 may be executed by an ASIC. It should be understood that some or all of the circuitry of FIG. 7 may, thus, be instantiated at the same or different times. Some or all of the circuitry may be instantiated, for example, in one or more threads executing concurrently and/or in series. Moreover, in some examples, some or all of the circuitry of FIG. 7 may be implemented within one or more virtual machines and/or containers executing on the microprocessor.

In some examples, the processor circuitry 912 of FIG. 9 may be in one or more packages. For example, the processor circuitry 1000 of FIG. 10 and/or the FPGA circuitry 1100 of FIG. 11 may be in one or more packages. In some examples, an XPU may be implemented by the processor circuitry 912 of FIG. 9, which may be in one or more packages. For example, the XPU may include a CPU in one package, a DSP in another package, a GPU in yet another package, and an FPGA in still yet another package.

Figure 12:
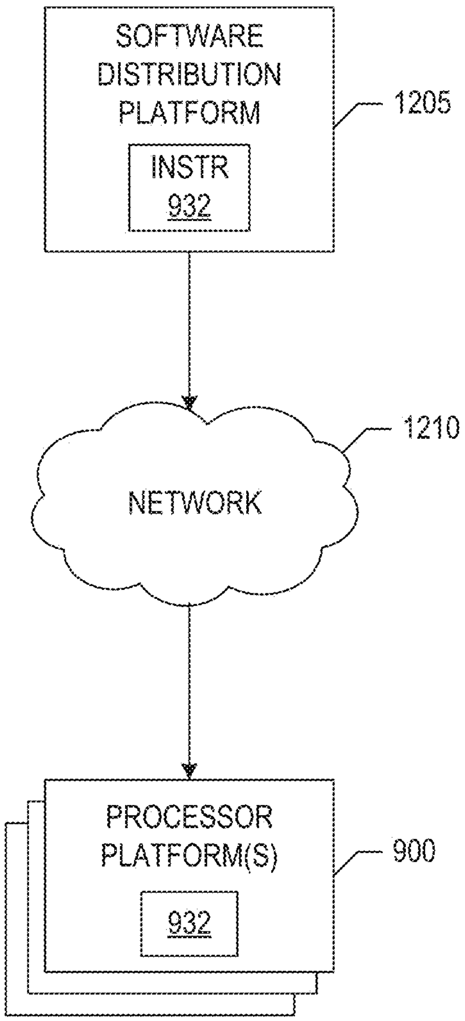
FIG. 12 is a block diagram of an example software distribution platform (e.g., one or more servers) to distribute software (e.g., software corresponding to the example machine readable instructions of FIG. 8) to client devices associated with end users and/or consumers (e.g., for license, sale, and/or use), retailers (e.g., for sale, re-sale, license, and/or sub-license), and/or original equipment manufacturers (OEMs) (e.g., for inclusion in products to be distributed to, for example, retailers and/or to other end users such as direct buy customers).

A block diagram illustrating an example software distribution platform 1205 to distribute software such as the example machine readable instructions 932 of FIG. 9 to hardware devices owned and/or operated by third parties is illustrated in FIG. 12. The example software distribution platform 1205 may be implemented by any computer server, data facility, cloud service, etc., capable of storing and transmitting software to other computing devices. The third parties may be customers of the entity owning and/or operating the software distribution platform 1205. For example, the entity that owns and/or operates the software distribution platform 1205 may be a developer, a seller, and/or a licensor of software such as the example machine readable instructions 932 of FIG. 9. The third parties may be consumers, users, retailers, OEMs, etc., who purchase and/or license the software for use and/or re-sale and/or sub-licensing. In the illustrated example, the software distribution platform 1205 includes one or more servers and one or more storage devices. The storage devices store the machine readable instructions 932, which may correspond to the example machine readable instructions 800 of FIG. 8, as described above. The one or more servers of the example software distribution platform 1205 are in communication with a network 1210, which may correspond to any one or more of the Internet and/or any of the example networks described above. In some examples, the one or more servers are responsive to requests to transmit the software to a requesting party as part of a commercial transaction. Payment for the delivery, sale, and/or license of the software may be handled by the one or more servers of the software distribution platform and/or by a third party payment entity. The servers enable purchasers and/or licensors to download the machine readable instructions 932 from the software distribution platform 1205. For example, the software, which may correspond to the example machine readable instructions 800 of FIG. 8, may be downloaded to the example processor platform 900, which is to execute the machine readable instructions 932 to implement the door analyzer 700. In some example, one or more servers of the software distribution platform 1205 periodically offer, transmit, and/or force updates to the software (e.g., the example machine readable instructions 932 of FIG. 9) to ensure improvements, patches, updates, etc., are distributed and applied to the software at the end user devices.

Example methods, apparatus, systems, and articles of manufacture to enable magnetic actuation of doors are disclosed herein. Further examples and combinations thereof include the following: Example 1 includes an apparatus comprising a door to be movably coupled to a frame of a computing device, a first magnet, a magnet array including a second magnet and a third magnet, the door to support the first magnet or the magnet array, and a slide including a body supporting the other of the first magnet or the magnet array, and a guide, the body to move along a path defined by the guide, wherein the body in a first location of the path causes the magnet array to attract the first magnet and close the door relative to the frame, and wherein the body in a second location of the path causes the magnet array to repel the first magnet and open the door relative to the frame.

Example 2 includes the apparatus as defined in example 1, wherein the body supports the magnet array.

Example 3 includes the apparatus as defined in any of examples 1 or 2, further including an electromagnet to cause movement of the slide.

Example 4 includes the apparatus as defined in any of examples 1 to 3, further including an actuator to cause movement of the slide.

Example 5 includes the apparatus as defined in example 4, further including a sensor to measure a temperature associated with the computing device, wherein the actuator is controlled to move the guide based on the measured temperature.

Example 6 includes the apparatus as defined in an of examples 1 to 5, wherein the slide defines a latch to lock the door to the frame.

Example 7 includes the apparatus as defined in any of examples 1 to 6, wherein the door is to pivot relative to the frame about an axis of rotation thereof.

Example 8 includes the apparatus as defined in example 7, wherein the movement of the body along the path is to vary an angle of rotation of the door relative to the frame.

Example 9 includes the apparatus as defined in any of examples 1 to 8, further including a fourth magnet on the door, and a sensor to detect a presence of the fourth magnet for determination of whether the door is open or closed.

Example 10 includes a computing device comprising processor circuitry, a frame, the processor circuitry supported by the frame, a door rotatably coupled to the frame to vary a size of an opening therebetween, the door including a first magnet, and a slide including a body and a guide, the body to support a magnet array having a second magnet and a third magnet, the body to move along a path of the guide, wherein the body positioned in a first location of the path causes the magnet array to attract the first magnet and close the door, and wherein the body positioned in a second location of the path causes the magnet array to repel the first magnet and open the door.

Example 11 includes the computing device as defined in example 10, further including a fourth magnet on the door, and a sensor to detect a presence of the fourth magnet for determination of whether the door is opened or closed.

Example 12 includes the computing device as defined in any of examples 10 or 11, further including a sensor to detect a presence of the slide.

Example 13 includes the computing device as defined in any of examples 10 to 12, wherein the slide defines a latch between the door and the frame.

Example 14 includes the computing device as defined in any of examples 10 to 13, further including an actuator to move the body with respect to the guide.

Example 15 includes the computing device as defined in example 14, further including a sensor to measure a temperature associated with the computing device, wherein the actuator is controlled to move the body based on the measured temperature.

Example 16 includes a non-transitory computer readable medium comprising instructions, which when executed, cause processor circuitry to determine, based on a thermal parameter, a desired displacement of a door relative to a frame of a computing device, and cause, based on the desired displacement, movement of a body of a slide along a path defined a guide, the slide supporting a first magnet or a magnet array having a second magnet and a third magnet, the frame supporting the other of the first magnet or the magnet array, wherein the movement of the slide is to cause the door to open when the body is in a first position of the path based on a repulsion between the first magnet and the array, and wherein the movement of the slide is to cause the door to open when the body is in a second position of the path based on an attraction between the first magnet and the magnet array.

Example 17 includes the non-transitory computer readable medium as defined in example 16, wherein the desired displacement is determined based on a measured thermal parameter of a computing device associated with the frame.

Example 18 includes the non-transitory computer readable medium as defined in any of examples 16 or 17, wherein the desired displacement is determined based on a size of a desired ventilation opening between the frame and the door.

Example 19 includes the non-transitory computer readable medium as defined in any of examples 16 to 18, wherein the body of the slide is caused to move based on directing an actuator.

Example 20 includes the non-transitory computer readable medium as defined in an of examples 16 to 19, wherein the body of the slide is caused to move based on directing an electromagnet.

From the foregoing, it will be appreciated that example systems, methods, apparatus, and articles of manufacture have been disclosed that cost-effective and reliable door control. Examples disclosed herein can enable accurate control in even relatively narrow angular ranges. Examples disclosed herein can improve cooling control to enable higher power consumption and/or performance-based operation of computing hardware, such as CPUs or GPUs.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. A housing for a computer, the housing comprising:
- a frame defining a vent;
- a door to be movably coupled to the frame, the door movable between a first position to at least partially close the vent and a second position to at least partially open the vent;
- a first magnet;
- a magnet array, the door to support the first magnet or the magnet array; and
- a slide including:
  - a body to support the other of the first magnet or the magnet array, and
  - a guide, the body to move along a path defined by the guide between a first location and a second location,
    - the magnet array to attract the first magnet and move the door to the first position when the body is in the first location, and
    - the magnet array to repel the first magnet and move the door to the second position when the body is in the second location.

2. The housing as defined in claim 1, wherein the body supports the magnet array.

3. The housing as defined in claim 1, including an electromagnet to cause movement of the slide.

4. The housing as defined in claim 1, including an actuator to cause movement of the slide.

5. The housing as defined in claim 4, including a sensor to measure a temperature associated with the computing device, the actuator controlled to move the guide based on the measured temperature.

6. The housing as defined in claim 1, wherein the slide defines a latch to lock the door to the frame.

7. The housing as defined in claim 1, wherein the door is to pivot external to the frame about an axis of rotation.

8. The housing as defined in claim 7, wherein the movement of the body along the path is to vary an angle of rotation of the door relative to the frame.

9. The apparatus as defined in claim 7, wherein the axis of rotation of the door is proximate an axis of rotation of a stand of the computing device.

10. The housing as defined in claim 1, including:
- a fourth magnet on the door; and
- a sensor to detect a presence of the fourth magnet for determination of whether the door is open or closed.

11. The apparatus as defined in claim 1, wherein the door is to pivot away from an external surface of the frame to increase flow through the vent.

12. A computing device comprising:
- processor circuitry;
- a frame, the processor circuitry supported by the frame, the frame having a vent for cooling the processor circuitry;
- a display carried by the frame;
- a door rotatably coupled to the frame to open or close the vent, the door including a first magnet; and
- a slide including a magnet array, the slide to move along a path between a first position and a second position,
  - the magnet array to attract the first magnet to close the door when the slide is in the first position, and
  - the magnet array to repel the first magnet to open the door when the slide is in the second position.

13. The computing device as defined in claim 12, including:
- a fourth magnet on the door; and
- a sensor to detect a presence of the fourth magnet for determination of whether the door is opened or closed.

14. The computing device as defined in claim 12, including a sensor to detect a presence of the slide.

15. The computing device as defined in claim 12, including an actuator to move the slide.

16. The computing device as defined in claim 15, including a sensor to measure a temperature associated with the computing device, wherein the actuator is controlled to move the slide based on the measured temperature.

17. A non-transitory computer readable medium comprising instructions to cause processor circuitry to:
- determine, based on a thermal parameter, a desired displacement of a door relative to a vent defined in a frame of a computing device; and
- cause, based on the desired displacement, movement of a slide along a path defined by a guide to move the door to vary a degree to which the vent is opened, the slide supporting a first magnet or a magnet array having a second magnet and a third magnet, the frame supporting the other of the first magnet or the magnet array, wherein the movement of the slide is to cause the door to open when the body is in a first position of the path based on a repulsion between the first magnet and the array, and wherein the movement of the slide is to cause the door to open when the body is in a second position of the path based on an attraction between the first magnet and the magnet array.

18. The non-transitory computer readable medium as defined in claim 17, wherein the desired displacement is determined based on a measured thermal parameter of the computing device associated with the frame.

19. The non-transitory computer readable medium as defined in claim 17, wherein the desired displacement is determined based on a size of a desired ventilation opening between the frame and the door.

20. The non-transitory computer readable medium as defined in claim 17, wherein the body of the slide is caused to move based on directing an actuator or an electromagnet.

* * * * *